United States Patent
Shintai

[19]

[11] Patent Number: 5,920,768
[45] Date of Patent: Jul. 6, 1999

[54] MANUFACTURING METHOD FOR A RESIN SEALED SEMICONDUCTOR DEVICE

[75] Inventor: Akira Shintai, Chita, Japan

[73] Assignee: Denso Corporation, Kariya, Japan

[21] Appl. No.: 08/991,250

[22] Filed: Dec. 16, 1997

[30] Foreign Application Priority Data

Dec. 19, 1996 [JP] Japan ................................. 8-339815

[51] Int. Cl.⁶ .................................................. H01L 21/44
[52] U.S. Cl. ........................................... 438/112; 438/127
[58] Field of Search .................................. 438/112, 124, 438/126, 127

[56] References Cited

U.S. PATENT DOCUMENTS

| | | | |
|---|---|---|---|
| 5,018,003 | 5/1991 | Yasunaga et al. | 438/124 |
| 5,672,550 | 9/1997 | Tsugi et al. | 438/124 |
| 5,733,802 | 3/1998 | Inoue et al. | 438/112 |
| 5,750,423 | 5/1998 | Ishii | 438/112 |

FOREIGN PATENT DOCUMENTS

| | | |
|---|---|---|
| 59-111334 | 6/1984 | Japan . |
| 1-158756 | 6/1989 | Japan . |
| 1-291434 | 11/1989 | Japan . |
| 2-10749 | 1/1990 | Japan . |
| 6-104364 | 4/1994 | Japan . |
| 6-302636 | 10/1994 | Japan . |
| 7-211740 | 8/1995 | Japan . |

*Primary Examiner*—Kevin M. Picardat
*Attorney, Agent, or Firm*—Pillsbury Madison & Sutro LLP

[57] ABSTRACT

A hybrid IC substrate and a power transistor are mounted on a mounting base so as to form a lead frame assembly. The hybrid IC substrate and the power transistor are electrically connected by wires. The lead frame assembly is held between upper and lower molding dies. Inner leads are arranged in a vicinity of an air vent communicating with a molding cavity defined between the upper and lower molding dies so as to protrude into the molding cavity. A liquefied molding resin is injected into the molding cavity from a gate at an upstream side of the molding cavity opposed to the inner leads. The injected molding resin is separated into upper and lower resin flows advancing above and below the lead frame assembly. Then, either of the upper and lower resin flows reaches a downstream side of the molding cavity and merges into the other resin flow after passing through clearances between the inner leads at a reduced speed decelerated by the inner leads, thereby filing the molding cavity with the molding resin without causing any void.

12 Claims, 8 Drawing Sheets

MANUFACTURING METHOD FOR A RESIN SEALED SEMICONDUCTOR DEVICE

BACKGROUND OF THE INVENTION

The present invention relates to a manufacturing method for a resin sealed semiconductor device, for example, applicable to a molding of a hybrid IC substrate with a resin to seal the entire body thereof. Especially, the present invention relates to a manufacturing method for eliminating the generation of undesirable voids in the resin during a molding process of the resin sealed semiconductor device.

In general, a hybrid IC substrate has an excellent durability against high voltages which cannot be handled by a silicon semiconductor element, as well as robustness against noises. These characteristics of the hybrid IC substrate are suitable for a semiconductor device installed in an automotive vehicle. In many cases, the hybrid IC substrate is incorporated in a control unit for a power actuator and is usually combined with a power transistor.

To realize an easy installation of the control unit to the power actuator, downsizing the control unit is necessarily required. Conventionally, a semiconductor device including a hybrid IC substrate is manufactured by using a resin casing. A semiconductor device is assembled beforehand in the resin casing. Liquefied resin is injected in the resin casing and hardened for sealing the semiconductor device with the resin. However, according to such a conventional method of using a resin casing is disadvantageous in that the downsizing of the mold product is not satisfactorily realized because the resin casing needs to be enlarged enough to assure a smooth flow of the liquefied resin.

As other manufacturing method not relying on a special molding casing, there is a mold sealing method which is conventionally employed for sealing a silicon semiconductor. FIG. 11 shows a resin sealed semiconductor device manufactured according to the conventional mold sealing method. A lead frame base 30 is assembled with a hybrid IC substrate 31 and a power transistor 32 mounted on an upper surface thereof. The assembled lead frame member is supported in a cavity defined between the molding dies. Then, a resin 33 is injected in the cavity to entirely seal the assembled body with the resin 33. According to this mold sealing method, the downsizing is realized satisfactorily due to no provision of the special molding casing. However, compared with the silicon semiconductor element, the hybrid IC substrate 31 is large in size. Furthermore, the longitudinal length of the lead frame base 30 is large because the hybrid IC substrate 31 and the power transistor 32 need to be molded together on this lead frame base 30.

Moreover, there is a necessity of radiating the heat generated from the power transistor 32 to the outside through the lead frame base 30 and the lower molding resin layer. Thus, to improve the heat radiation property, the thickness of the lower molding resin layer needs to be reduced adequately. On the other hand, a chip 34 is mounted on the hybrid IC substrate 31. The power transistor 32 and the hybrid IC substrate 31 and the inner frames 35 are connected by wires 36 and 37. To provide a sufficient space for these components mounted on the lead frame base 30, the thickness of the upper molding resin layer needs to be increased adequately. In other words, the upper and lower molding resin layers are not uniform in their thicknesses.

The above-described complicated, elongated and unbalanced structural features of the semiconductor device possibly causes a speed difference between the resin flows in a molding operation when the injected resin is separated into the upper and lower regions of the molding cavity and advance in the longitudinal direction toward an air vent. More specifically, one resin flow advances in the upper region of the molding cavity and is decelerated by the obstacles, such as the hybrid IC substrate 31 and the power transistor 32, which protrude upward from the lead frame base 30. On the other hand, the other resin flow advances in the lower region of the molding cavity and smoothly moves along the flush bottom surface of the lead frame base 30.

FIG. 12 shows another conventional resin sealed semiconductor device according to which the bottom of the lead frame base 30 is not resin molded. This arrangement is advantageous in improving the heat radiation property, however is not reliable in the durability against repetitive thermal cycles because there is a significant thermal expansion difference between the molded resin 33 and the lead frame base 30. Thus, the molded resin 33 is possibly peeled off the surface of the lead frame base 30. The sensitive circuit components, such as chip 34 mounted on the hybrid IC substrate 31, will be damaged by moisture or dusts entering from the outside through a clearance formed at the peeled portion.

FIG. 13 shows another conventional resin sealed semiconductor device according to which the upper side of the hybrid IC 31 is coated beforehand with a thick resin coating material 38. According to this arrangement, the speed of the resin flow advancing in the upper region of the cavity can be decelerated adequately so as to eliminate the speed difference between the upper and lower resin flows. However, according to this structure, the wires 36 and 37 are subjected to and may be broken by a thermal stress derived from a thermal expansion coefficient difference between the coating material 38 and the molding material 33.

In view of the foregoing, it is definitely necessary to solve the problems arisen during a molding operation of a resin molded semiconductor device when the upper and lower resin layers are not uniform in their thicknesses. More specifically, there is a possibility that a significant amount of voids may remain in the cavity due to a flow speed difference between the upper and lower resin flows.

To eliminate the generation of such undesirable voids, Unexamined Japanese Patent Application No. 1-158756, published in 1989, proposes to provide a gate at a lower position and restricts the upward resin flow by a protrusion of a lead frame. Unexamined Japanese Patent Application No. 6-104364, published in 1994, proposes to provide a protrusion on a lead frame to equalize the upper and lower resin flow speeds. However, these arrangements are disadvantageous in that an overall size of the molded product becomes large due to the provision of the special protrusions.

Furthermore, Unexamined Japanese Patent Application No. 1-291434, published in 1989, proposes to use a slidable mold in an upper die in the vicinity of a gate to restrict the resin flow by controlling the position of the slidable mold. However, this arrangement is disadvantageous in that the slidable mold may interfere with a chip or other components mounted on a hybrid IC substrate.

SUMMARY OF THE INVENTION

In view of the above-described problems, the present invention has an object of providing a manufacturing method for manufacturing a compact and reliable resin sealed semiconductor device, by molding a hybrid IC substrate together with a semiconductor chip, such as a power transistor, without casing voids of residual air even when the resin thicknesses above and below a lead frame assembly are differentiated.

In order to accomplish this and other related objects, a first aspect of the present invention provides a novel and excellent manufacturing method for a resin sealed semiconductor. A hybrid IC substrate and a semiconductor chip are mounted on a mounting base so as to form a lead frame assembly. The lead frame assembly is held between an upper molding die and a lower molding die, while inner leads are disposed in a vicinity of an air vent communicating with a molding cavity defined between the upper and lower molding dies so as to protrude into this molding cavity. A liquefied molding resin is injected into the molding cavity from a gate at an upstream side of the molding cavity opposed to the inner leads, so that the injected molding resin is separated into upper and lower resin flows advancing above and below the lead frame assembly. Then, either of the upper and lower resin flows reaches a downstream side of the molding cavity and merges into the other resin flow after passing through clearances between the inner leads at a reduced speed decelerated by the inner leads, thereby filing the molding cavity with the molding resin without causing any void.

Preferably, in the above-described manufacturing method, the following relationship is satisfied:

$$(t1/t2)^{(3+4B)} \leq (L1+2 \cdot L2)/L1$$

where "t1" represents the thickness of the upper resin flow, "t2" represents the thickness of the lower resin flow, "L1" represents a distance from the gate to a downstream end of the mounting base of the lead frame assembly, "L2" represents a distance from the downstream end of the mounting base to the air vent, and "B" represents a coefficient representing resin viscosity dependency to a shear rate $\tau$ when the molding resin has a viscosity $\eta = \beta \tau^B$.

Furthermore, the following relationship is satisfied when the content of a filler contained in the molding resin exceeds 70%:

$$(t1/t2)^{0.4} \leq (L1+2 \cdot L2)/L1$$

where "t1" represents the thickness of the upper resin flow, "t2" represents the thickness of the lower resin flow, "L1" represents a distance from the gate to a downstream end of the mounting base of the lead frame assembly, and "L2" represents a distance from the downstream end of the mounting base to the air vent.

A second aspect of the present invention provides a novel and excellent manufacturing method for a resin sealed semiconductor. A hybrid IC substrate is mounted on a mounting base so as to form a lead frame assembly. The lead frame assembly is held between an upper molding die and a lower molding die so that the mounting base of the lead frame assembly is disposed in a molding cavity defined between the upper and lower molding dies. Then, a liquefied molding resin is injected into the molding cavity from a gate at an upstream side of the molding cavity so that residual air remaining in the molding cavity is discharged via an air vent provided at a downstream side of the molding cavity. A clearance between the hybrid IC substrate and the upper molding die and a distance from a downstream end of the mounting base to the air vent provided at the downstream side of the molding cavity satisfy a predetermined relationship. So, either of upper and lower resin flows advancing above and below the lead frame assembly reaches the downstream side of the molding cavity and merges into the other resin flow within a region between the downstream end of the mounting base and the downstream side of the molding cavity.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENT

Figure 1:
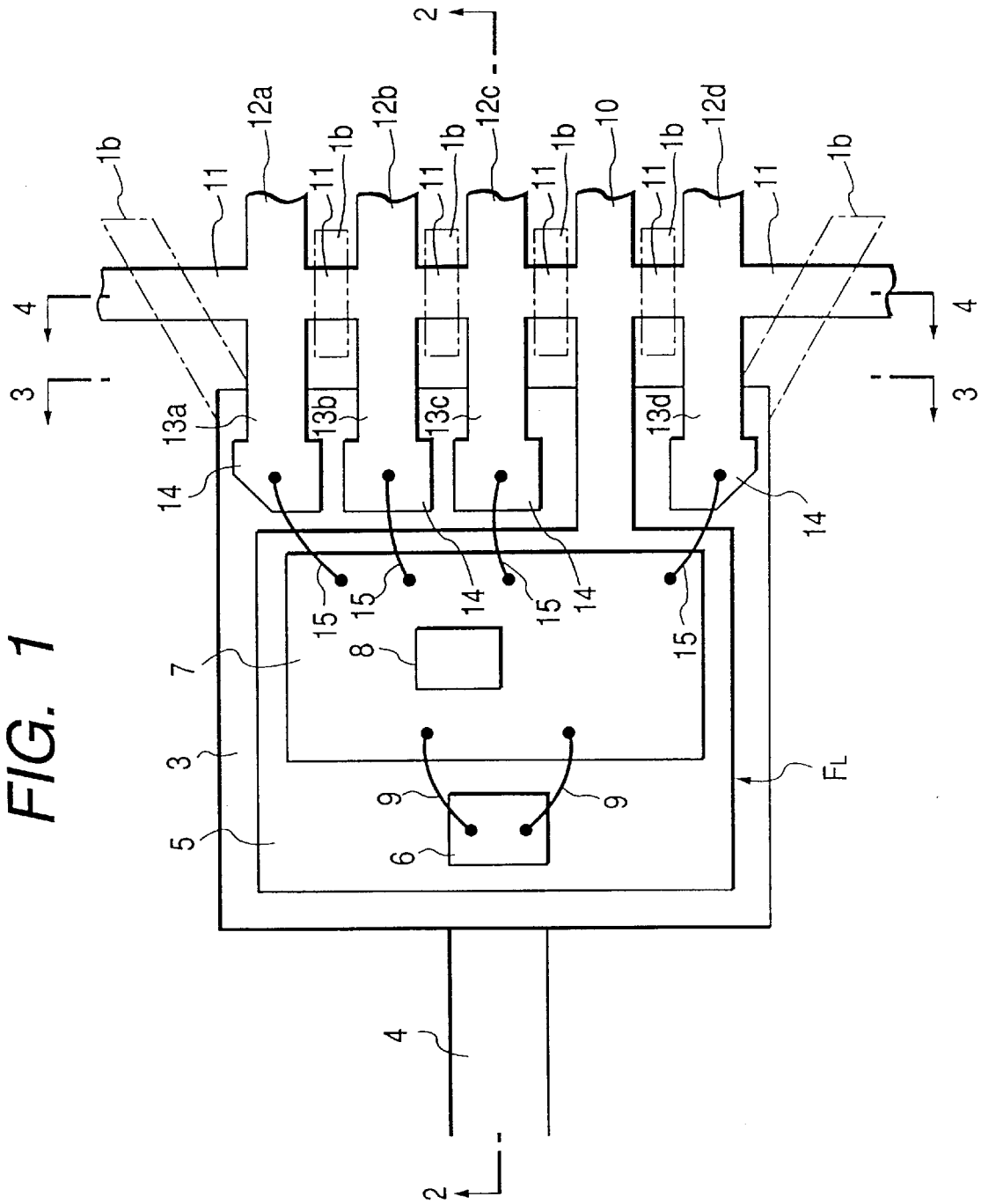
FIG. 1 is a plan view showing an arrangement of a manufacturing apparatus of a resin sealed semiconductor device using a pair of upper and lower molding dies for resin sealing a semiconductor device in a molding cavity in accordance with a preferred embodiment of the present invention.

A preferred embodiment of the present invention will be explained hereinafter with reference to accompanied drawings. Identical parts are denoted by the same reference numerals throughout the drawings.

Figure 2:
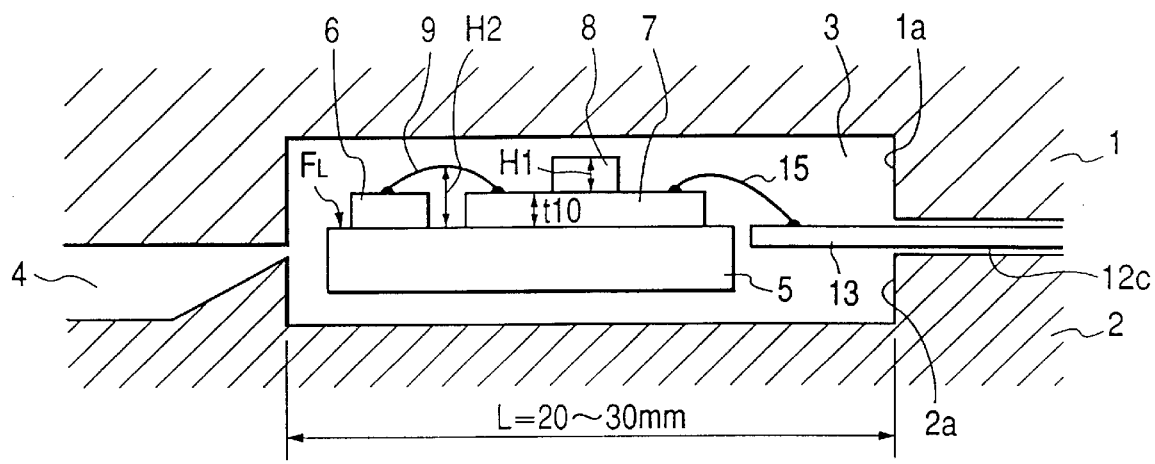
FIG. 2 is a cross-sectional view taken along a line A—A of FIG. 1.
Figure 3:
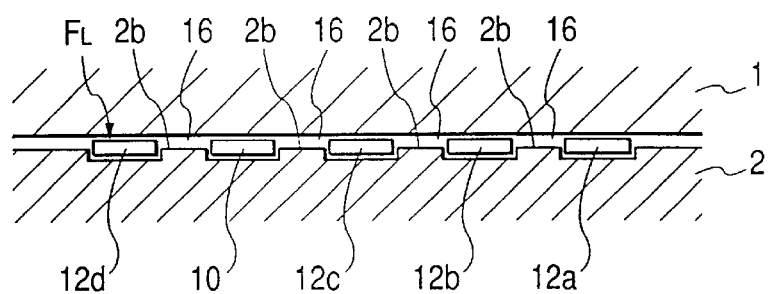
FIG. 3 is a cross-sectional view taken along a line B—B of FIG. 1.
Figure 4:
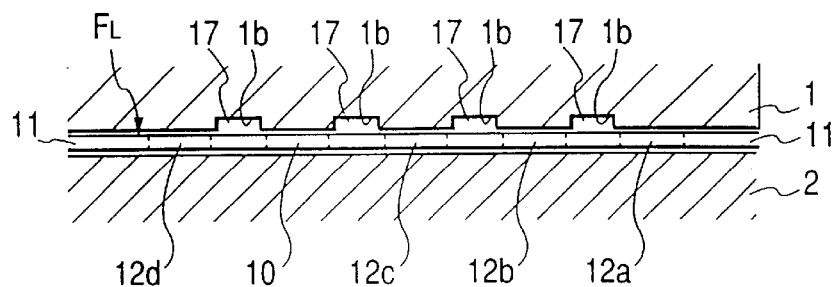
FIG. 4 is a cross-sectional view taken along a line C—C of FIG. 1.

FIG. 1 is a plan view showing the arrangement of a manufacturing apparatus for a resin sealed semiconductor device using a pair of upper and lower molding dies for resin sealing a semiconductor device in a molding cavity. For convenience of the explanation, FIG. 1 shows a condition where the upper molding die is removed. FIG. 2 is a cross-sectional view taken along a line A—A of FIG. 1. FIG. 3 is a cross-sectional view taken along a line B—B of FIG. 1. FIG. 4 is a cross-sectional view taken along a line C—C of FIG. 1. In each of FIGS. 2 through 4, the upper molding die removed from FIG. 1 is shown and assembled with the lower molding die in a predetermined engaged or coupled relationship to define a molding cavity.

The upper and lower molding dies 1 and 2 are cooperatively used for sealing a semiconductor device with a resin and therefore define a molding cavity 3 between them when assembled in the predetermined engaged or coupled relationship. As shown in FIG. 2, a lower surface of the upper molding die 1 is partly concaved to form a rectangular recessed portion 1a, while an opposed upper surface of the lower molding die 2 is correspondingly concaved to form a rectangular recessed portion 2a just opposing to the recessed portion 1a so as to define the molding cavity 3 having a rectangular box-like configuration. Furthermore, the upper and lower molding dies 1 and 2 cooperatively define a gate 4 extending from the left (i.e., upstream) side of the molding cavity 3 as shown in FIGS. 1 and 2. The leading end of the gate 4, connected to the molding cavity 3, is narrowed in width to form an inlet for injection of the liquefied resin to the molding cavity 3.

A lead frame assembly $F_L$ comprises a rectangular mounting base 5, on which a power transistor 6, as a semiconductor chip, and a hybrid IC substrate 7 are mounted. Various electronic parts, such as a chip component 8, are mounted on the hybrid IC substrate 7. The power transistor 6 is electrically connected to the hybrid IC substrate 7 by means of wires 9.

A support lead 10 is integral with and extends from the mounting base 5 toward a downstream side of the molding cavity 3. A plurality of outer leads 12a, 12b, 12c and 12d are integrally connected with the support lead 10 via a tie lead 11 extending perpendicularly to the outer leads 12a–12d. The outer leads 12a, 12b, 12c and 12d are located at the right side (i.e., a downstream side opposing to the gate 4) beyond the mounting base 5 as shown in FIGS. 1 and 2. The upper and lower molding dies 1 and 2 firmly hold or clamp each of these outer leads 12a, 12b, 12c and 12d without leaving clearances in the up-and-down direction.

A plurality of inner leads 13a, 13b, 13c and 13d are integral with and respectively extend inward (i.e., toward the upstream side of the molding cavity 3) from the corresponding outer leads 12a, 12b, 12c and 12d. The inner leads 13a, 13b, 13c and 13d are positioned in an inside hollow space of the molding cavity 3. A widened portion 14 is integral with and formed at the distal end of each of the inner leads 13a, 13b, 13c and 13d. The width of this widened portion 14 is wider than that of each inner lead. The tie lead 11 has a function of maintaining a predetermined clearance between each adjacent two of the outer leads 12a to 12d during a resin molding operation. After the resin molding operation is finished, the tie lead 11 is cut off. Thus, the outer leads 12a to 12d are electrically isolated from one another.

The inner leads 13a–13d are electrically connected to the hybrid IC substrate 7 via wires 15, respectively.

As shown in FIG. 3, a vacant space or clearance formed between each adjacent two of the above-described leads 10 and 12a–12d is an air vent 16. Namely, the upper and lower molding dies 1 and 2 are positioned in the up-and-down direction so as to oppose each other with a clearance between them. This clearance serves as the air vent 16 extending between each adjacent two of the above-described leads 10 and 12a–12d. In more detail, dam blocks 2b protrude upward from the lower molding die 2 between the leads 10 and 12a–12d. A significant vertical clearance is maintained for each air vent 16 when the upper and lower dies 1 and 2 are closed. The vertical clearance of each air vent 16, in a closed condition of the upper and lower molding dies 1 and 2, is identical with a gap between the dam block 2b and the upper molding die 1.

As shown in FIG. 4, an air vent 17 is formed above the tie lead 11 between each adjacent two of the leads 10 and 12a to 12d. More specifically, the lower surface of the upper molding die 1 is concaved at a portion opposing to the tie lead 11, forming the air vent 17 extending in parallel with the leads 10 and 12a–12d. The air vent 17 communicates with the above-described air vent 16, to cooperatively scavenge or exhaust the residual air in the molding cavity 3 to the outside.

A portion finally remaining as part of the lead is airtightly held or clamped between the upper and lower molding dies 1 and 2. This is effective to suppress generation of burr of mold resin on the surface of the lead. A practical size of the air vent 16 and 17 is in a range of 10 to 40 $\mu$m.

Next, a manufacturing method of fabricating a resin sealed semiconductor apparatus will be explained.

First, the power transistor 6 and the hybrid IC substrate 7 are mounted on the mounting base 5. Then, a wire bonding operation is performed to electrically connect the power transistor 6 with the hybrid IC substrate 7 by means of wires 9 as well as electrically connect the hybrid IC substrate 7 with the inner leads 13a to 13d by means of wires 15.

Then, the lead frame assembly $F_L$ is held or clamped between the upper and lower dies 1 and 2. In this condition, both the power transistor 6 and the hybrid IC substrate 7 are uncovered or exposed. The inner leads 13a to 13d protrude into the molding cavity 3 in the vicinity of the air vent 16 and 17.

Thereafter, a liquefied molding resin is injected into the molding cavity 3 via the gate 4 to seal the entire body of the lead frame assembly $F_L$ with the resin.

Figure 5:
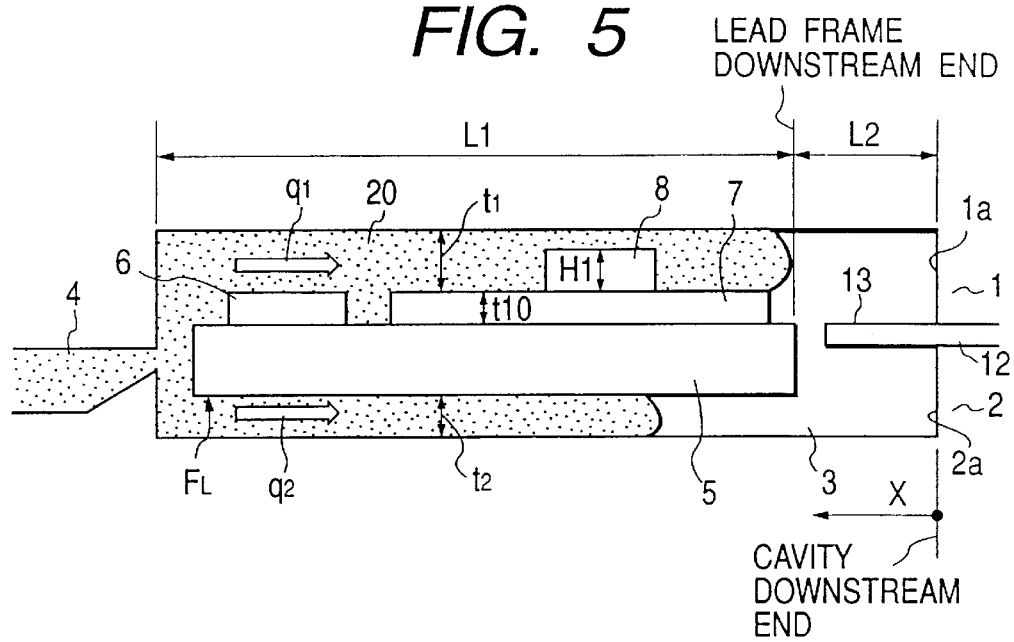
FIG. 5 is a cross-sectional view illustrating the behavior of the resin flow in the molding cavity.

During the injection of the molding resin, an inside space of the molding cavity 3 is separated into an upper region and a lower region partitioned by the lead frame assembly $F_L$, as shown in FIG. 5. The molding resin, when advancing in the upper cavity above the lead frame assembly $F_L$, has a vertical thickness t1 which is significantly thick enough to avoid the disturbance by the chip component 8 or the wires 9 and 15. For example, the hybrid IC substrate 7 has a vertical thickness t10 of approximately 0.6 mm. The chip component 8 has a height H1 of approximately 1.3 mm. The height of the wire (denoted by H2 in FIG. 2), i.e., the highest point of the wires 9 and 15 from the mounting base 5, is approximately 2 mm. Accordingly, the practical thickness t1 of the molding resin in the upper cavity needs to be approximately 2.3 to 2.6 mm. On the other hand, the molding resin, when advancing in the cavity lower region below the lead frame assembly $F_L$, has a vertical thickness t2 which is significantly thin to improve heat radiation and downsize the molded body. A practical size of the vertical thickness t2 is in the range of 0.7 to 1.1 mm. In FIG. 2, L represents a longitudinal length of the molding cavity 3, extending from the upstream side corresponding to the inlet of the gate 4 to the downstream side. A practical size of the longitudinal length L is approximately 20 to 30 mm.

The molding resin used in this embodiment is a mixture of an epoxy resin and a mineral filler (e.g., molten silica). The resin material used in this embodiment is not limited to the epoxy resin and can be replaced by other thermosetting resin, such as a phenol resin, a silicone resin, or polyimide resin. The molten silica used as the mineral filler in this embodiment is superior to other materials in view of the reduction of a later-described thermal stress. However, other mineral filler, such as alumina, silicon nitride, or crystalline silica, can be added as additive. As other components, molding releasing agent, coloring agent, elasticity reducing improver, and curing catalyst are mixed together with the molding resin.

Returning to the explanation of the manufacturing process, when the liquefied molding resin 20 is injected into the molding cavity 3 as shown in FIG. 5, residual air is scavenged or exhausted out of the molding cavity 3 via the air vent 16 and 17.

In this air ventilation process, there is a possibility that a void or voids may remain in the molding cavity 3 due to imbalance of the ventilation speeds between the cavity upper and lower regions. More specifically, as shown in FIG. 5, part of the molding resin 20 injected from the gate 4 flows in the upper cavity at a higher speed because the recessed portion 1a of the upper molding die 1 has a large thickness (i.e., low fluid resistance). On the other hand, the remainder of the molding resin 20 flows in the lower cavity at a lower speed because the recessed portion 2a of the lower molding die 2 has a smaller thickness (i.e., low fluid resistance). Accordingly, at the time the resin flow in the upper cavity reaches the downstream side of the molding cavity 3 where the air vent 16 and 17 is provided, the resin flow in the lower cavity has not reached the air vent 16 and 17. As a result, a significant amount of air resides in the recessed portion 2a of the lower molding die 2. The volume of the residual air can be reduced to a certain degree under the resin pressure during a succeeding molding process. However, the void cannot be completely eliminated and causes a defect in the final product.

However, according to the above-described embodiment of the present invention, the molding resin 20 filling the recessed portion 1a of the upper molding die 1 flows into the recessed portion 2a of the lower molding die 2, passing through the clearances between the inner leads 13a to 13d. In this moment, the molding resin 20 is subjected to a higher fluid resistance because of the narrowed clearances between inner leads 13a to 13d. Thus, the flow speed of the molding resin 20 is decelerated when the molding rein 20 flows into the recessed portion 2a of the lower molding die 2. During the time lag thus obtained, the molding resin 20 flowing in the recessed portion 2a of the lower molding die 2 can advance a significant distance, reducing the total amount of the residual air which causes a void or voids in the lower cavity.

In this manner, the inner leads 13a to 13d are arranged to oppose the gate 4 (i.e., the upstream side) and positioned at a downstream portion where the molding resin 20 in the upper region flows into the lower region of the molding cavity 3. This arrangement is effective to reduce the flow speed of the molding resin entering into the recessed portion 2a of the lower molding die 2 after filing the recessed portion 1a of the upper molding die 1, suppressing the generation of undesirable voids.

Figure 6:
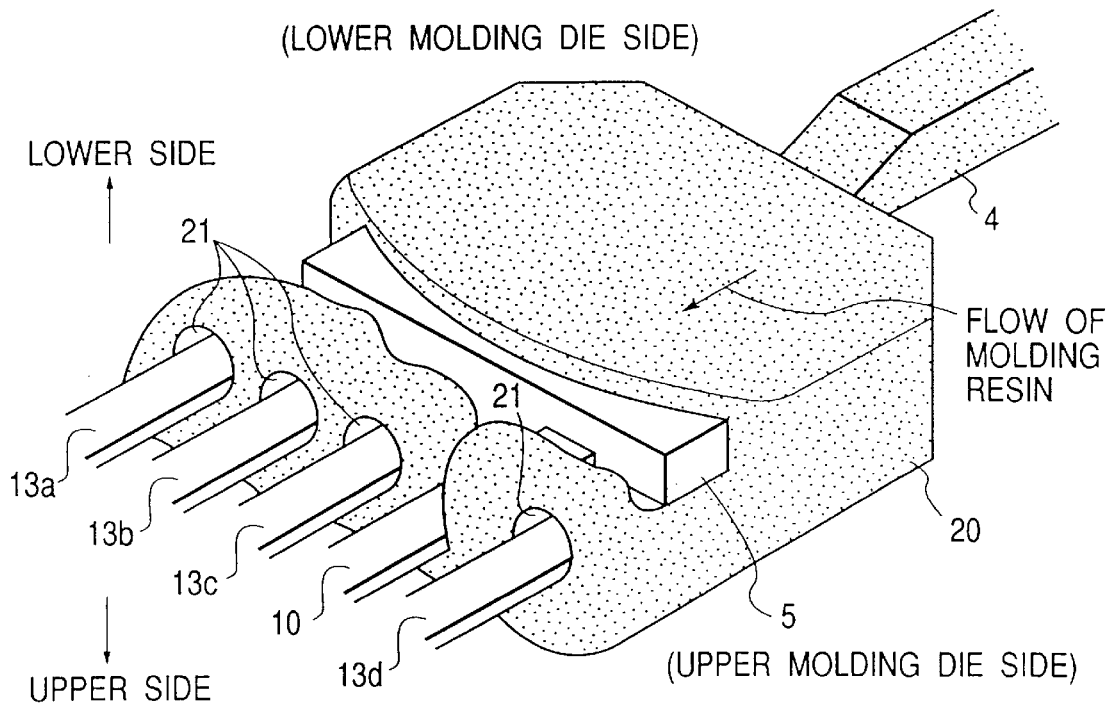
FIG. 6 is a perspective view illustrating the behavior of the resin flow in the molding cavity.

Furthermore, as shown in FIG. 6, a tunnel 21 is formed beneath each inner lead 13a to 13d when the molding resin 20 passes through the clearances between the inner leads 13a–13d. Each tunnel 21 serves as an air vent for scavenging or exhausting the residual air remaining in the recessed portion 2a of the lower molding die 2. This is advantageous because the generation of undesirable voids can be effectively suppressed without increasing the number or volume of the air vent opened directly in the molding dies.

To confirm the effects of the above-described preferred embodiment of the present invention, various experiments were conducted.

Figure 7:
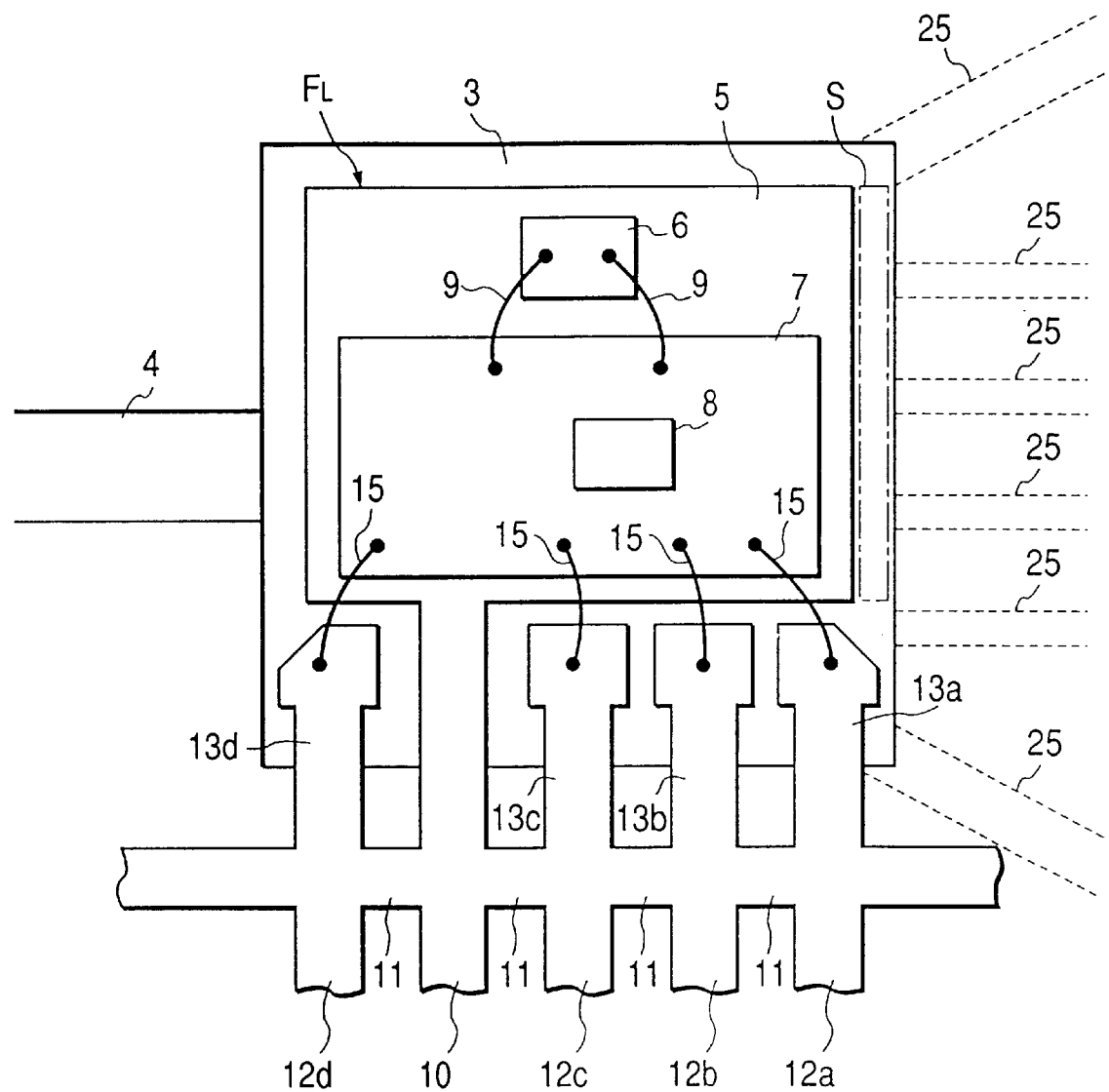
FIG. 7 is a plan view showing an arrangement of a comparative manufacturing apparatus.

FIG. 7 shows an arrangement of a comparative sample which is identical with the above-described embodiment in the configuration except for the position of the gate 4 and air vent 25. According to this comparative example, the inner leads 13a to 13d are arranged along another side of the molding cavity 3 different from the downstream side where the molding resin 20 finally reaches. In other words, no inner leads opposes the gate 4. The air vent 25 is thus freely arranged along the entire surface opposing the gate 4 so as to improve the air ventilation efficiency.

However, as a result of the resin molding operation experimentally performed, the arrangement shown in FIG. 7 was inferior to the arrangement shown in FIG. 1 because the undesirable void was always found in the sample of FIG. 7 under various molding conditions (e.g., variations of the injection pressure and the die temperature), while no void was found in the embodiment of FIG. 1.

Regarding the reason why such a difference exists, it is believed that the flow behavior of the molding resin 20 in the vicinity of the downstream side (i.e., the side opposed to the gate 4) in the molding cavity 3 plays an important role. More specifically, according to the arrangement shown in FIG. 1, the molding resin 20 flowing in the recessed portion 1a of the upper molding die 1 enters into the recessed portion 2a of the lower molding die 2 after filling the cavity 3 defined by the recessed portion 1a, passing through the narrow clearances between inner leads 13a to 13d. The flow speed of the molding resin 20 is fairly reduced at this moment, promoting air ventilation or discharge through the air vent 16 and 17. This brings the effect of considerably reducing the amount of the residual air finally remaining in the recessed portion 2a, as well as effectively suppressing the generation of undesirable voids.

Further, as explained with reference to FIG. 6, the tunnels 21 serving as an air vent are formed beneath (i.e., at the downstream side of) the inner leads 13a to 13d when the molding resin 20 passes through the clearances between the inner leads 13a to 13d. Thus, the residual air can be smoothly scavenged or exhausted from the recessed portion 2a of the lower molding die 2 through these tunnels 21, effectively suppressing the generation of undesirable voids.

On the contrary, according to the arrangement of FIG. 7, the inner leads 13a to 13d are not provided on the downstream side of the molding cavity 3 (i.e., not opposed to the gate 4). Thus, no air vent is formed by the molding resin itself. The arrangement of FIG. 7 cannot form the vent equivalent to the tunnels 21 of the above-described preferred embodiment. This is why the comparative sample was defective as a mold product.

Namely, the resin enters into the molding cavity 3 from the gate 4 and partly flows in the upper cavity above the lead frame assembly $F_L$ at a higher speed because the upper cavity has a small flow resistance due to a large thickness provided for avoiding the interference between the molding resin 20 and the hybrid IC substrate 7 or the like installed on the mounting base 5. The molding resin 20 has reached the downstream side of the molding cavity 3, and then flows into the lower cavity below the lead frame assembly $F_L$ through a wide opened clearance (indicated by S in FIG. 7) between the mounting base 5 and the downstream end wall of the molding cavity 3. In this moment, there is no disturbance or obstacle resisting the downward flow of the molding resin 20 when the molding resin 20 passes through the clearance S. This is disadvantage in that the air vent 25 are easily and immediately closed by the molding resin 20. As a result, a large quantity of air remains in the lower cavity below the lead frame assembly $F_L$, finally remaining as a void or voids of residual air.

In this respect, providing the obstacle such as the inner leads 13a to 13d is effective to restrict the flow of the molding resin 20 when the molding resin 20 passes through the clearance S. The amount of the residual air remaining below the lead frame assembly $F_L$ can be reduced considerably. Thus, no void is finally produced.

Furthermore, when the molding resin 20 flows in a downward direction through the clearances between the inner leads 13a to 13d, the tunnel 21 acting as an air vent is formed beneath each inner lead. Formation of such tunnels 21 is effective to discharge the residual air smoothly, resulting in no void generation.

To bring satisfactory effects of the above-described preferred embodiment of the present invention, it is fundamentally necessary that the inner leads 13a to 13d have substantial restricting ability against the flow of the molding resin. In other words, the area ratio of the inner leads 13a to 13d to the clearance S needs to be larger than a predetermined value. However, an upper limit for the area ratio needs to be determined considering the electrical insulation requirement that the inner leads 13a to 13d need to be electrically isolated from one another. Furthermore, to prevent any leakage at the outside of the molded body, it is definitely necessary to provide a predetermined clearance between adjacent leads.

Accordingly, to satisfy these requirements, it is effective to narrow the width of the outer leads 12a to 12d (which are not mold sealed) and to widen the width of the inner leads 13a to 13d (which are sealed by the molding resin). To realize this, the above-described preferred embodiment of the present invention provides the widened portions 14 integral with and formed at the distal ends of the inner leads 13a to 13d as shown in FIG. 1.

Next, an experimental result is explained. This experiment was conducted for optimizing the difference in the resin thickness between the upper and lower regions of the cavity with respect to the lead frame assembly. The inventor of the present invention confined in this experiment an acceptable range with respect to the flow speed difference between the upper and lower resin flows, for gaining the effects of the present invention.

More specifically, in the arrangement of FIG. 1, the thickness of the hybrid IC substrate 7 installed on the mounting base 4 of the lead frame assembly $F_L$ is varied from a smaller value to a larger value to check the occurrence of any void while monitoring the position and size of a produced void.

Figure 8:
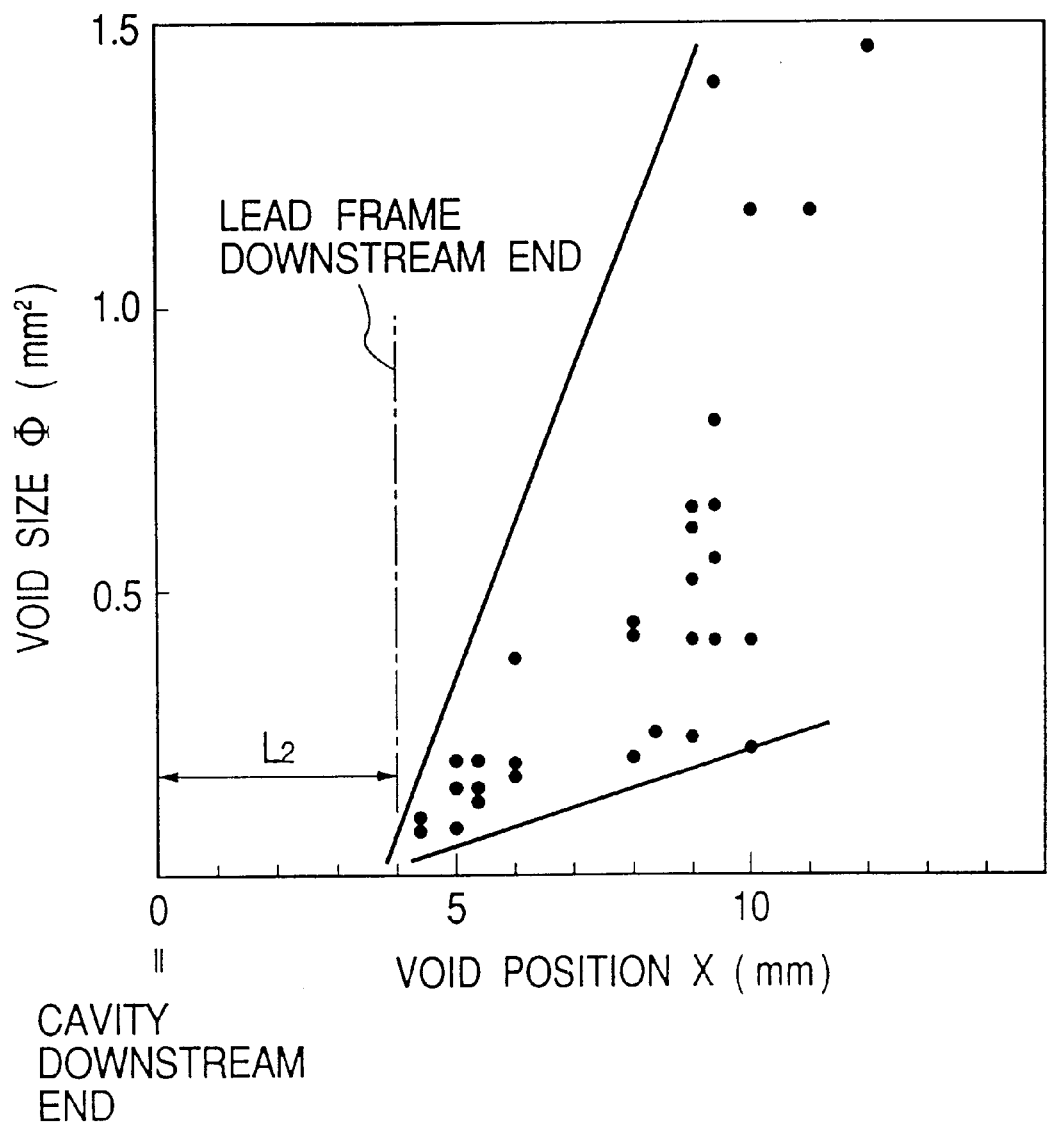
FIG. 8 is a graph showing measured results as a relationship between a void position and a void size.

FIG. 8 shows a graph showing the experimental result. The abscissa of FIG. 8 represents a void position (i.e., the position of each monitored void). In this experiment, the void position is expressed as a distance (mm) measured from the downstream side of the molding cavity 3 (i.e., the cavity end wall opposed to the gate 4) where the air vent is opened. For example, when the void position is 5 mm, the monitored void is spaced 5 mm from the downstream side of the molding cavity 3. Meanwhile, the void position represents a final merge point between the upper resin flow and the lower resin flow. The far the void position from the cavity end wall, the large the flow speed difference between the upper and lower resin flows.

The ordinate of FIG. 8 represents a void size (e.g., the diameter of each monitored void). Having a larger void size is that a larger amount of residual air remains in the lower cavity below the lead frame assembly $F_L$.

FIG. 8 shows a correlation between the void position X and the void size Φ. The smaller the void position X, the smaller the void size Φ. There is a region where no void is generated. This specific region is referred to as a voidless region in comparison with the void region where a significant amount of void is found. The voidless region is in the vicinity of the downstream side of the molding cavity 3. As indicated by an alternate long and short dash line in FIG. 8, it is confirmed that the boundary between the voidless region and the void region substantially coincides with the downstream end of the mounting base 5 of the lead frame assembly $F_L$.

The presence of the voidless region extending in the vicinity of the downstream side of the molding cavity 3 apparently shows the effect of providing the inner leads 13a to 13d. In other words, according to the above-described preferred embodiment of the present invention, it becomes possible to completely eliminate the void generation even when the flow speed of the upper resin flow is not identical with the flow speed of the lower resin flow. More specifically, an acceptable speed difference between the upper and lower resin flows is determined in terms of the merge point between the upper and lower resin flows. According to the above-described experimental result, an acceptable merge point is located in a region between the downstream end of the mounting base 5 of the lead frame assembly $F_L$ and the air vent.

To schematically express the internal structure of the molding cavity 3 shown in FIG. 5, numerous variables are used in the following explanation.

In FIG. 5, "L1" represents a distance from the leading edge of the gate 4 (i.e., the inlet of the cavity 3) to the downstream end of the mounting base 5 of the lead frame assembly $F_L$. "L2" represents a distance from the downstream end of the mounting base 5 to the opening of the air vent 16 and 17 (i.e., the downstream end of the molding cavity 3). Furthermore, "t1" represents the thickness of the molding resin 20 flowing in the recessed portion 1a of the upper molding die 1 (i.e., the clearance between the upper surface of the hybrid IC substrate 7 and the opposing surface of the upper molding die 1). Similarly, "t2" represents the thickness of the molding resin 20 flowing in the recessed portion 2a of the lower molding die 2 (i.e., the clearance between the bottom surface of the mounting base 5 and the opposing surface of the lower molding die 2). Moreover, "q1" represents the flow speed of the molding resin 20 flowing in the recessed portion 1a of the upper molding die 1, while "q2" represents the flow speed of the molding resin 20 flowing in the recessed portion 2a of the lower molding die 2.

Using the above-defined variables, the above-described acceptable range is expressed by the following formula.

$$q1/q2 \leq (L1+2 \cdot L2)/L1 \tag{1}$$

In this case, it is assumed that the molding resin 20 in the upper cavity reaches the cavity downstream end wall and then continuously flows in the opposite direction.

From the formula (1), it is understood that the molding operation can be accomplished successfully by setting the flow speed ratio (q1/q2) between the upper and lower resin flows adequately, i.e., somewhere in the range defined by the formula (1).

The flow speed ratio (q1/q2) between the upper and lower resin flows varies depending on the viscosity characteristics of the resin as well as the dimensions of the molding cavity 3. However, a quantitative calculating of the influence of these factors is very complicated.

The inventor of the present invention studied the influence of these factors and finally found the following formula (2).

$$q1/q2=(t1/t2)^{(3+4B)} \tag{2}$$

where B is a coefficient representing a shear rate dependency of the resin viscosity which is unique to each resin.

The resin flow speed q in the molding cavity 3, generally expressed by the following formula (3), is proportional to the cube of the resin thickness t and reverse proportional to the resin viscosity η.

$$q=\alpha \cdot t^3/\eta \tag{3}$$

where α is a collective coefficient including other factors giving no influence to the flow speed ratio (q1/q2).

The resin viscosity η is dependent on the resin shear rate τ and expressed by the following formula (4).

$$\eta = \beta \tau^B \quad (4)$$

where β is a collective coefficient including non-sensitive factors giving no influence to the flow speed ratio (q1/q2) including the influence of the resin temperature.

In the formula (4), "B" is the above-described coefficient representing the shear rate dependency of the resin viscosity. In general, B is a minus value somewhere in a range of −0.5 to −0.7. The larger the resin shear rate τ, the smaller the resin viscosity η.

The resin shear rate τ is roughly dependent on the fluid cross section and the flow speed q at a portion where the resin flows. The thinner the resin thickness t, the smaller the fluid cross section. The thinner the resin thickness t, the larger the resin shear rate τ.

On the contrary, a portion having a larger resin thickness has a smaller resin shear rate τ when the flow speed q is constant.

To estimate the resin flow speed q in each of the upper and power regions in the molding cavity, it is necessary to estimate the resin viscosity η according to the formula (3). To estimate the resin viscosity η, it is necessary to estimate the resin shear rate τ. To estimate the resin shear rate τ, it is necessary to estimate the resin flow speed q. In this manner, the resin flow speed q, the resin viscosity η and the resin shear rate τ are mutually dependent and give influence one another. In other words, it is difficult to use a simplified calculation for estimating all of these factors.

Accordingly, the inventor of the present invention used a computer-based numerical analysis to solve the above-described relationship, and obtained a correlation between the resin shear rate τ and the resin thickness t based on a flow estimation method, i.e., resin flow analysis method.

Figure 9:
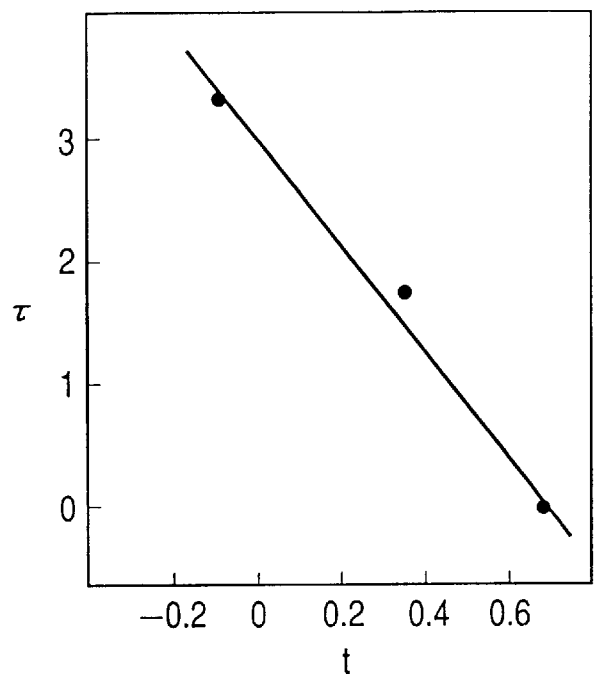
FIG. 9 is a graph showing a relationship between a resin thickness t and a shearing rate $\tau$.

The embodiment shown in FIGS. 1 to 4 is used as a model for this analysis. FIG. 9 shows the result obtained through the analysis. From the result of FIG. 9, the following formula (5) is derived as an approximation representing the correlation between the resin shear rate τ and the resin thickness t.

$$\tau = \gamma t^{-4} \quad (5)$$

Thus, it is concluded that the resin shear rate τ is reverse proportional to $t^4$.

By substituting the formulas (4) and (5) into the formula (3), the above-described formula (2) is derived as a rearranged relationship.

Furthermore, considering the formula (1), the acceptable range for a successful molding operation is expressed by the following formula (6).

$$(t1/t2)^{(3+4B)} \leq (L1+2 \cdot L2)/L1 \quad (6)$$

In the process of deriving the above-described relationship (6), some of assumptions and simulations are used for approximations. However, it was confirmed that the finally obtained relationship (6) was adequately applicable to many of actually fabricated samples.

Accordingly, it becomes possible to successfully perform a molding operation by designing the dimensions of the molding cavity so as to satisfy the relationship defined by the formula (6), even when the resin thickness in the upper cavity is different from that of the lower cavity.

In the formula (6), the coefficient B represents the shear rate dependency of the resin viscosity. The smaller the coefficient B, the smaller the resin flow speed ratio (q1/q2). Thus, by reducing the coefficient B, the acceptable range satisfying the formula (6) can be enlarged.

As a method for reducing the coefficient B, increasing the filler content is effective as disclosed in Unexamined Japanese Patent Application No. 63-15449, published in 1988. The resin viscosity is an index representing the degree of the resin movement when the resin is subjected to a shearing distortion. In this respect, the resin viscosity is regarded as a flow resistance.

More specifically, the movement resistance of the resin is measured as a shearing stress and is expressed as a viscosity (JISK7199 etc) corresponding to the measured value. The shearing rate dependency can be controlled by mixing a filler. Its mechanism, although not known in detail, can be explained in the following manner.

When a mineral filler is added to a resin, the movement of the resin is restricted by the filler in the vicinity of the filler surface. Thus, the resin as a whole cannot move smoothly. Its viscosity is increased. When a shearing stress is applied, the filler moves together with the resin. The effect obtained by adding the filler is reduced.

On the other hand, the filler content influences the thermal expansion coefficient of the sealing resin. According to the arrangement of the above-described preferred embodiment of the present invention, the hybrid IC substrate 7 is made of ceramics having a thermal expansion coefficient of approximately $8 \times 10^{-6}/°$ C.

Figure 10:
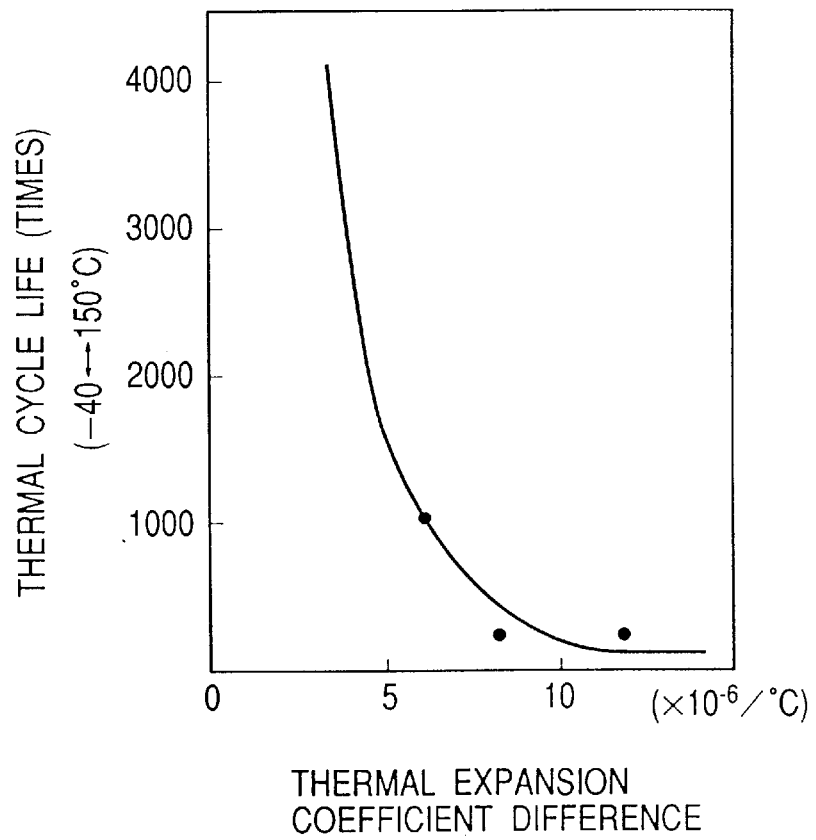
FIG. 10 is a graph showing a relationship between a thermal expansion coefficient difference and a thermal cycle life.
Figure 11:
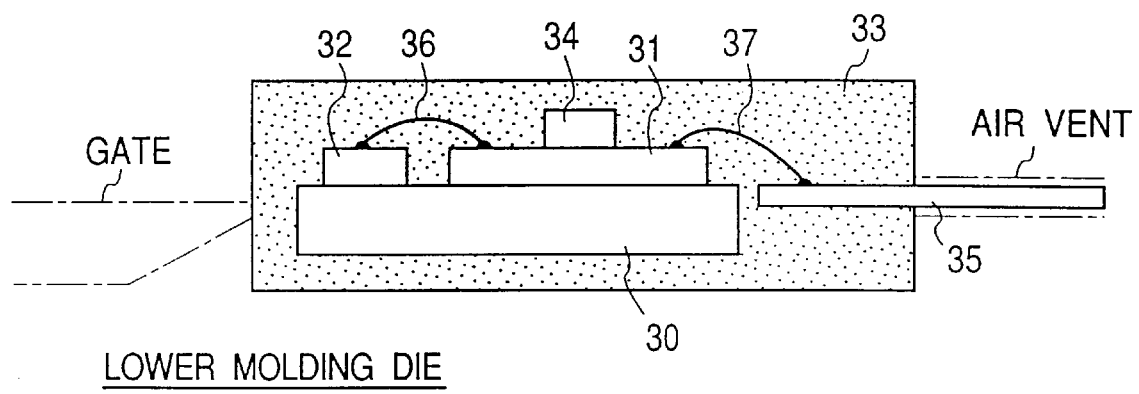
FIG. 11 is a cross-sectional view showing a conventional resin sealed semiconductor device.

Regarding the thermal expansion coefficient, there may be a large difference between the sealing resin 20 and the hybrid IC substrate 7. In such a case, a significant amount of thermal stress will be generated. This thermal stress may damage the component 8 mounted on the hybrid IC substrate 7. As shown in FIG. 10, when the thermal expansion coefficient difference is less than $6 \times 10^{-6}/°$ C., the thermal cycle life is greatly improved.

To suppress the thermal expansion coefficient difference within $6 \times 10^{-6}/°$ C., it is effective to use a molten silica having a smaller thermal expansion coefficient ($0.5 \times 10^{-6}/°$ C.) as a filler for the sealing resin. It is preferable that the voluminal percentage of the molten silica filler is equal to or larger than 70%.

Using a sealing resin material having a 70% filler content, numerous samples of various sizes and configurations were tested to check or measure their molding results. The coefficient B in the formula (6) has a value inherent to the resin. The value of this coefficient B was estimated using the measured data. As a result, the formula (6) is rewritten into the following formula (7).

$$(t1/t2)^{0.4} \leq (L1+2 \cdot L2)/L1 \quad (7)$$

When the filler content percentage exceeds 70%, the shearing rate dependency of the resin viscosity increases and, therefore, the acceptable range satisfying the formula (7) is enlarged. The thermal expansion coefficient difference is reduced. This improves the reliability of the mold product.

Accordingly, when the hybrid IC substrate is directly mold sealed, it is definitely necessary to satisfy the formula (7) for obtaining adequate and reliable mold results.

Various experiments were conducted to confirm the effects of the present invention. The results of the experiments will be explained hereinafter with reference to Table 1.

TABLE 1

Figure 12:
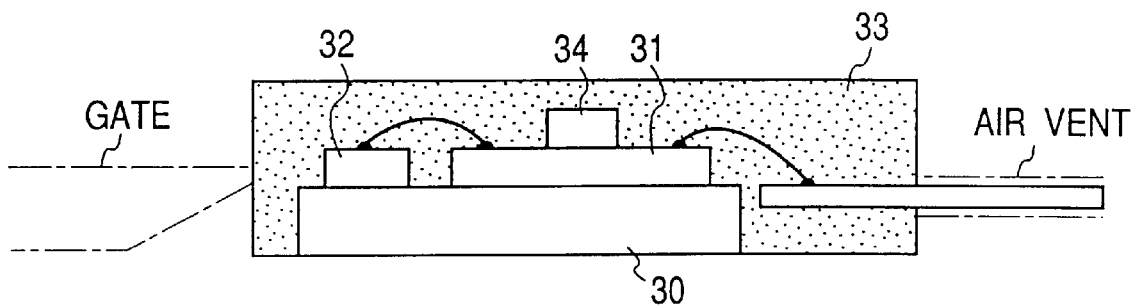
FIG. 12 is a cross-sectional view showing another conventional resin sealed semiconductor device.
Figure 13:
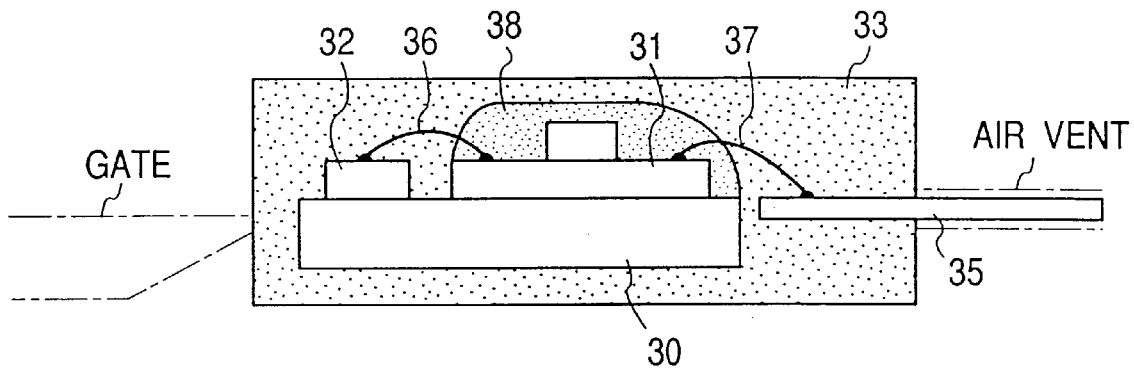
FIG. 13 is a cross-sectional view showing another conventional resin sealed semiconductor device.

| | EMBODIMENT OF INVENTION | COMPARATIVE SAMPLE 1 | COMPARATIVE SAMPLE 2 | COMPARATIVE SAMPLE 3 | COMPARATIVE SAMPLE 4 | COMPARATIVE SAMPLE 5 |
|---|---|---|---|---|---|---|
| FILLER CONTENT | 75% | 75% | 75% | 68% | 75% | 75% |
| SEALING ARRANGEMENT | FIG. 1 | FIG. 7 | FIG. 1 | FIG. 1 | FIG. 13 | FIG. 12 |
| L1(mm) | 18.5 | 18.5 | 18.5 | 18.5 | 18.5 | 18.5 |
| L2(mm) | 3.5 | 1.0 | 3.5 | 3.5 | 3.5 | 3.5 |
| t1(mm) | 2.0 | 2.0 | 2.0 | 2.0 | 2.0 | 2.0 |
| t2(mm) | 0.9 | 0.9 | 0.6 | 0.9 | 0.6 | — |
| $(t1/t2)^{(3+4B)}$ | 1.25 | 1.25 | 1.40 | 1.46 | 1.40 | — |
| $(L1 + 2 \cdot L2)/L1$ | 1.38 | 1.11 | 1.38 | 1.38 | 1.38 | — |
| ESTABLISHMENT OF FORMULAS (6) AND (7) | ○ | x | x | x | x | — |
| DEFECTIVE GENERATION RATE(%) | 0% | 100% | 10% | 20% | 0% | 0% |
| THERMAL CYCLE LIFE (DAMAGE MODE) | 3,000 TIMES OR MORE | 3,000 TIMES OR MORE | 3,000 TIMES OR MORE | 800 (COMPONENT ON SUBSTRATE IS DAMAGED) | 300 (WIRE IS BROKEN) | 50 (LEAD SEAL RESIN IS PEELED OFF |

*1- filler material is molten silica.
*2- coefficient "B" is approximately −0.68 for 75% filler content and −0.63 for 68% filler content.

The embodiment of the present invention is a semiconductor apparatus shown in FIG. 1, sealed by an epoxy resin molding material with 75% filler content. This embodiment satisfies the formula (7) and showed a satisfactory molding result. As the hybrid IC substrate 7 and the wires 9 and 15 are directly sealed by the resin, a stress acting on the wires 9 and 15 is small. Good results were obtained in a thermal cycle test. It is preferable to provide a thin coating, such as a glass or resin coating, on the surface of the hybrid IC substrate 7 at a region not giving adverse influence to the wires 9 and 15.

The comparative sample 1 is based on the arrangement of FIG. 7 where the inner leads 13a to 13d are arranged along a cavity side not opposing to the gate 4. The defective generation rate was 100%. This result counteractively demonstrates the effect of the layout of inner leads 13a to 13d according to the arrangement of FIG. 1.

The comparative sample 2 is identical with the preferred embodiment of the present invention but in the structure but is different in that the resin thickness t2 is shorter and does not satisfy the formula (6). The mold result was not satisfactory, and a significant amount of voids were generated. This result counteractively demonstrates the validity or adequacy of the requirement defined by the formula (6).

The comparative sample 3 is identical with the preferred embodiment of the present invention but in the structure but is different in that the filler content percentage is lowered to 68% and does not satisfy the formula (6). The mold result was not satisfactory, and the component mounted on the hybrid IC substrate 7 was damaged. The reliability was lowered.

The comparative sample 4 is based on the arrangement shown in FIG. 13 wherein the upper surface of the hybrid IC substrate 31 is coated by a thick liquefied resin 38 before commencing the molding operation. Regarding the structural dimensions of the comparative sample 4, the resin thickness t2 at the lower cavity below the lead frame assembly is thinner than that of the preferred embodiment of the present invention and does not satisfy the formula (6). However, the mold result was acceptable because the resin flow in the upper cavity is adequately decelerated by the thick resin coating 38 provided on the hybrid IC substrate 31. However, as the wires 36 and 37 bridge the molding resin 33 and the coating resin 38, these wires 36 and 37 are broken during the thermal cycle test. Thus, the reliability was not satisfactory.

The comparative sample 5 is based on the arrangement shown in FIG. 12 wherein the bottom of the lead frame 30 mounting the hybrid IC substrate 31 is uncovered or exposed to the outside although only the upper side is sealed. The mold result was satisfactory. However, the resin 33 was peeled off the lead frame 30 during the thermal cycle test. This possibly induces damage of the internal elements, lowering the reliability of the mold product.

As described in the foregoing description, the preferred embodiment of the present invention has the following characteristic features.

As shown in FIGS. 1 through 4, the lead frame assembly $F_L$ is held between the upper molding die 1 and the lower molding die 2 for sealing the hybrid IC substrate 7 with a molding resin. The upper and lower molding dies 1 and 2 cooperatively define the molding cavity 3. The inner leads 13a to 13d are arranged in the vicinity of the air vent 16 and 17 and protrude into the molding cavity 3. The liquefied molding resin 20 is injected from the gate 4. Part of the molding resin 20 flows in the upper cavity above the lead frame assembly $F_L$, while the remainder of the molding resin 20 flows in the lower cavity below the lead frame assembly $F_L$. Either of the upper and lower resin flows, which advances faster than the other, reaches the downstream side of the cavity 3 and then enters into the other region through the narrow clearances between the inner leads 13a to 13d and merges into the leading edge of other resin flow, thereby filling the cavity 3 with the molding resin 20.

According to the above-described molding operation, the molding resin 20 is subjected to a significant amount of flow resistance when it passes through the narrow clearances between the inner leads 13a to 13d. Thus, the speed of the faster resin flow is adequately decelerated by the inner leads 13a to 13d. During the time lag thus obtained, residual air in the cavity 3 can be smoothly scavenged or exhausted. Thus, it becomes possible to eliminate the generation of voids.

When the power transistor 6 is incorporated in the lead frame assembly $F_L$, the lower cavity is narrowed to improve the heat radiation property. In this case, the resin flow in the upper cavity advances faster than resin flow in the lower cavity. Thus, the upper resin flow reaches the downstream end of cavity 3 faster than the lower resin flow, and then enters into the lower cavity through the narrow clearances between the inner leads 13a to 13d provided in the vicinity of the air vent 16 and 17. In this downward movement of the upper resin flow, the tunnel 21 acting as an air vent is formed beneath each inner lead as shown in FIG. 6. Formation of such tunnels 21 is effective to discharge the residual air smoothly to the air vent 16 and 17, resulting in no generation of voids.

In this manner, the present invention makes it possible to perform a molding operation successfully even when the resin thickness of the upper cavity above the lead frame assembly $F_L$ is not identical with that of the lower cavity below the lead frame assembly $F_L$. Thus, a simultaneous molding operation for the hybrid IC substrate 7 and the power transistor 6 can be realized. This is advantageous in realizing the downsizing and improving the reliability.

When the relationship $(t1/t2)^{(3+4B)} \leq (L1+2 \cdot L2)/L1$ is satisfied, it becomes possible to merge one resin flow into the other resin flow at a portion where no void is generated.

When the molten silica with voluminal percentage 70% is used as a filler, it is preferable to satisfy the relationship $(t1/t2)^{0.4} \leq (L1+2 \cdot L2)/L1$. It is practically preferable to specify the type of the filler and the content so that an optimum or acceptable range can be enlarged.

This invention may be embodied in several forms without departing from the spirit of essential characteristics thereof. The present embodiment as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A manufacturing method for a resin sealed semiconductor comprising the steps of:

mounting a hybrid IC substrate and a semiconductor chip on a mounting base so as to form a lead frame assembly;

holding said lead frame assembly between an upper molding die and a lower molding die, while arranging inner leads protruding into a molding cavity defined between said upper and lower molding dies in a vicinity of an air vent communicating with said molding cavity;

injecting a liquefied molding resin into said molding cavity from a gate at an upstream side of said molding cavity opposed to said inner leads, so that the injected molding resin is separated into upper and lower resin flows advancing above and below said lead frame assembly, then either of said upper and lower resin flows reaches a downstream side of said molding cavity and merges into the other resin flow after passing through clearances between said inner leads at a reduced speed decelerated by said inner leads, thereby filling said molding cavity with the molding resin without causing any void, wherein the following relationship is satisfied:

$(t1/t2)^{(3+4B)} < (L1+2 \cdot L2)/L1$ where "t1" represents the thickness of said upper resin flow, "t2" represents the thickness of said lower resin flow, "L1" represents a distance from said gate to a downstream end of said mounting base of said lead frame assembly, "L2" represents a distance from said downstream end of said mounting base to said air vent and "B" represents a coefficient representing resin viscosity dependency to a shear rate $\tau$ when the molding resin has a viscosity $\eta = \beta \tau^B$.

2. The manufacturing method for a resin sealed semiconductor in accordance with claim 1, wherein the following relationship is satisfied when the content of a filler contained in said molding resin exceeds 70%:

$(t1/t2)^{0.4} \leq (L1+2 \cdot L2)/L1$.

3. A manufacturing method for a resin sealed semiconductor comprising the steps of:

mounting a hybrid IC substrate on a mounting base so as to form a lead frame assembly;

holding said lead frame assembly between an upper molding die and a lower molding die so that said mounting base of said lead frame assembly is disposed in a molding cavity defined between said upper and lower molding dies; and injecting a liquefied molding resin into said molding cavity from a gate at an upstream side of said molding cavity so that upper and lower resin flows of said liquefied molding resin advance along upper and lower surfaces of said lead frame assembly toward a downstream side of said molding cavity, thereby discharging residual air remaining in said molding cavity via an air vent provided at said downstream side of said molding cavity, wherein one of said upper and lower resin flows decelerates when passing through clearances of inner leads protruding from said downstream side of said molding cavity and then merges into the other resin flow within a region between a downstream end of said mounting base and said downstream side of said molding cavity.

4. The manufacturing method for a resin sealed semiconductor in accordance with claim 1, wherein a widened portion is integrally formed at a distal end of each inner lead, thereby decelerating the resin flow passing through the clearances between said inner leads.

5. The manufacturing method for a resin sealed semiconductor in accordance with claim 4, wherein said resin sealed semiconductor is a semiconductor device installed in an automotive vehicle.

6. The manufacturing method for a resin sealed semiconductor in accordance with claim 4, wherein the thickness "t1" of said upper resin flow is larger than the thickness "t2" of said lower resin flow, and said upper resin flow is faster than said lower resin flow.

7. The manufacturing method for a resin sealed semiconductor in accordance with claim 3, wherein the distance "L2" is equal to or less than 4 mm.

8. The manufacturing method for a resin sealed semiconductor in accordance with claim 3, wherein a widened portion is integrally formed at a distal end of each inner lead, thereby decelerating the resin flow passing through the clearances between said inner leads.

9. The manufacturing method for a resin sealed semiconductor in accordance with claim 8, wherein said resin sealed semiconductor is a semiconductor device installed in an automotive vehicle.

10. The manufacturing method for a resin sealed semiconductor in accordance with claim 8, wherein said upper resin flow is thicker and faster than said lower resin flow.

11. The manufacturing method for a resin sealed semiconductor in accordance with claim 8, wherein a distance from said downstream end of said mounting base to said air vent is equal to or less than 4 mm.

12. A manufacturing method for a resin sealed semiconductor comprising the steps of:

mounting a hybrid IC substrate and a semiconductor chip on a mounting base so as to form a lead frame assembly;

holding said lead frame assembly between an upper molding die and a lower molding die, while arranging inner leads protruding into a molding cavity defined between said upper and lower molding dies in a vicinity of an air vent communicating with said molding cavity;

injecting a liquefied molding resin into said molding cavity from a gate at an upstream side of said molding cavity opposed to said inner leads, so that the injected molding resin separates into upper and lower resin flows advancing along upper and lower surfaces of said lead frame assembly, and one of said upper and lower resin flows decelerates when passing through clearances between widened portions formed at distal ends of said inner leads and then merges into the other resin flow within a region between a downstream end of said mounting base and said downstream side of said molding cavity, thereby filling said molding cavity with the molding resin without causing any void.

* * * * *